United States Patent
Hashimoto et al.

(10) Patent No.: US 10,490,977 B2
(45) Date of Patent: Nov. 26, 2019

(54) SURFACE-EMITTING QUANTUM CASCADE LASER

(71) Applicant: KABUSHIKI KAISHA TOSHIBA, Minato-ku (JP)

(72) Inventors: Rei Hashimoto, Edogawa (JP); Shinji Saito, Yokohama (JP); Yuichiro Yamamoto, Yokohama (JP); Tsutomu Kakuno, Fujisawa (JP); Kei Kaneko, Yokohama (JP); Tomohiro Takase, Sagamihara (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 16/185,875

(22) Filed: Nov. 9, 2018

(65) Prior Publication Data

US 2019/0148912 A1 May 16, 2019

(30) Foreign Application Priority Data

Nov. 16, 2017 (JP) .................. 2017-220735

(51) Int. Cl.
*H01S 5/10* (2006.01)
*H01S 5/34* (2006.01)
(Continued)

(52) U.S. Cl.
CPC .......... *H01S 5/1096* (2013.01); *H01S 5/0604* (2013.01); *H01S 5/105* (2013.01);
(Continued)

(58) Field of Classification Search
CPC ...... H01S 5/1096; H01S 5/0425; H01S 5/105; H01S 5/183; H01S 5/3402; H01S 5/34313; H01S 5/42; H01S 5/3401
See application file for complete search history.

(56) References Cited

U.S. PATENT DOCUMENTS

2008/0048792 A1 2/2008 Ouchi et al.
2013/0163630 A1 6/2013 Nagatomo et al.
(Continued)

FOREIGN PATENT DOCUMENTS

JP 2003-298183 10/2003
JP 2008-53519 3/2008
(Continued)

OTHER PUBLICATIONS

Vijayraghavan, K., et al. "Terahertz sources based on Cerenkov difference-frequency generation in quantum cascade lasers", Applied Physics Letters, 100, 251104, 2012, 5 pages.

*Primary Examiner* — Armando Rodriguez
(74) *Attorney, Agent, or Firm* — Oblon, McClelland, Maier & Neustadt, L.L.P.

(57) ABSTRACT

A surface-emitting quantum cascade laser of an embodiment comprises a substrate, an active layer, and a photonic crystal layer. The active layer has optical nonlinearity, and is capable of emitting a first and a second infrared laser light. The photonic crystal layer includes a first and a second region. The rectangular grating of the first region is orthogonal to the rectangular grating of the second region. The first infrared laser light has a wavelength corresponding to a maximum gain outside a first photonic bandgap in a direction parallel to a first side of two sides constituting the rectangular grating. The second infrared laser light has a wavelength corresponding to a maximum gain outside a second photonic bandgap in a direction parallel to a second side of the two sides of the rectangular grating.

12 Claims, 9 Drawing Sheets

(51) Int. Cl.
*H01S 5/183* (2006.01)
*H01S 5/343* (2006.01)
*H01S 5/042* (2006.01)
*H01S 5/06* (2006.01)
*H01S 5/18* (2006.01)
H01S 5/02 (2006.01)
H01S 5/026 (2006.01)
H01S 5/12 (2006.01)
H01S 5/22 (2006.01)

(52) U.S. Cl.
CPC ............... *H01S 5/18* (2013.01); *H01S 5/183* (2013.01); *H01S 5/34313* (2013.01); *H01S 5/026* (2013.01); *H01S 5/0207* (2013.01); *H01S 5/0425* (2013.01); *H01S 5/12* (2013.01); *H01S 5/22* (2013.01); *H01S 5/3402* (2013.01); *H01S 2302/02* (2013.01)

(56) References Cited

U.S. PATENT DOCUMENTS

| | | |
|---|---|---|
| 2017/0033536 A1 | 2/2017 | Fujita et al. |
| 2017/0063038 A1 | 3/2017 | Ito et al. |
| 2017/0222399 A1* | 8/2017 | Hirose ..................... H01S 5/18 |
| 2019/0074663 A1 | 3/2019 | Saito et al. |

FOREIGN PATENT DOCUMENTS

| | | |
|---|---|---|
| JP | 2012-64749 | 3/2012 |
| JP | 2015-162663 | 9/2015 |
| JP | 2017-33981 | 2/2017 |
| JP | 2017-50308 | 3/2017 |
| JP | 2019-47023 A | 3/2019 |

\* cited by examiner

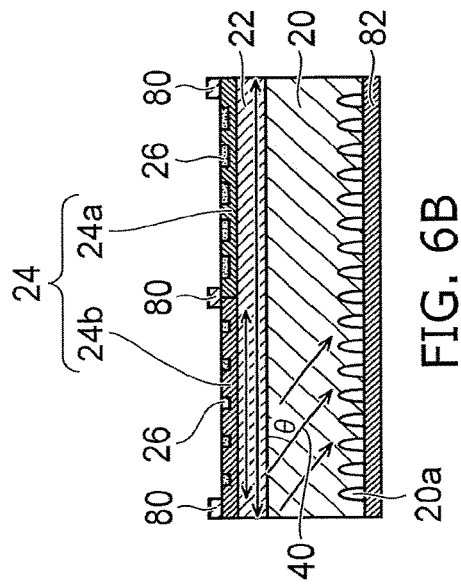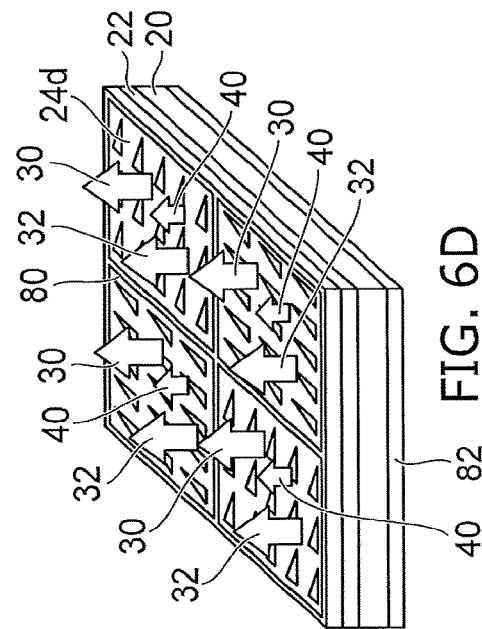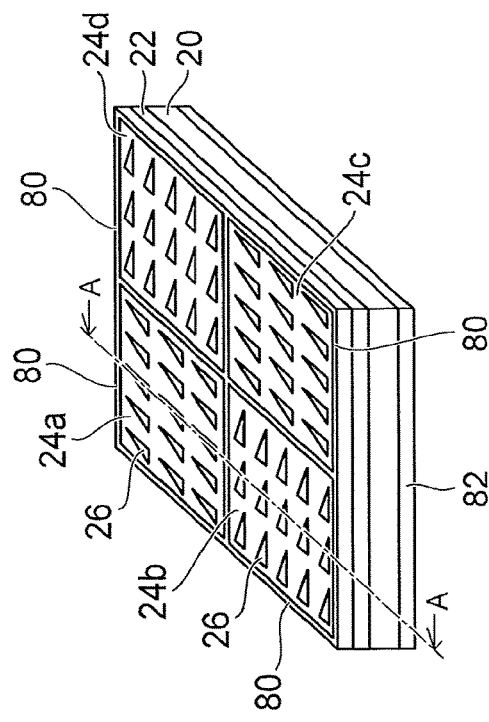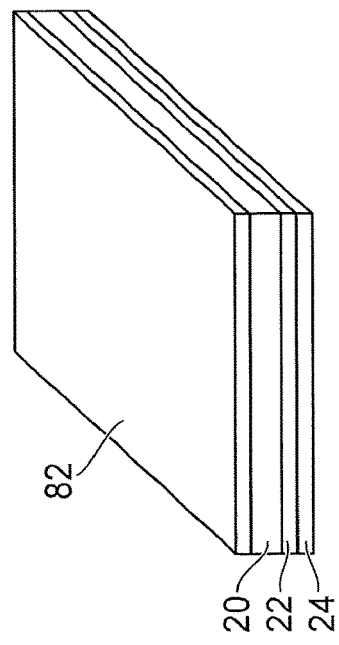

ASPECT RATIO $= \dfrac{B}{A}$

«SURFACE-EMITTING QUANTUM CASCADE LASER»

SURFACE-EMITTING QUANTUM CASCADE LASER

CROSS-REFERENCE TO RELATED APPLICATIONS

This application is based upon and claims the benefit of priority from Japanese Patent Application No. 2017-220735, filed on Nov. 16, 2017; the entire contents of which are incorporated herein by reference.

FIELD

Embodiments described herein relate generally to a surface-emitting quantum cascade laser.

BACKGROUND

When a photonic crystal layer including a two-dimensional grating has anisotropy, it provides a surface-emitting quantum cascade laser capable of emitting infrared laser light in a direction generally perpendicular to the active layer.

When the two-dimensional grating has the same pattern over the entire surface of the light outgoing surface, the infrared laser light is emitted with a single wavelength.

However, emitting infrared laser light with different wavelengths is required in the case of e.g. generating terahertz waves.

BRIEF DESCRIPTION OF THE DRAWINGS

FIG. 6A is a schematic perspective view of an example of the chip provided with an upper electrode and a lower electrode in the first embodiment, FIG. 6B is a schematic sectional view taken along line A-A, FIG. 6C is a schematic perspective view of the back surface of the chip, and FIG. 6D is a schematic perspective view showing an example of the emission direction of the infrared laser light and the terahertz wave;

DETAILED DESCRIPTION

In general, a surface-emitting quantum cascade laser of an embodiment comprises a substrate, an active layer, and a photonic crystal layer. The active layer is provided on the substrate, has optical nonlinearity, and is capable of emitting a first and a second infrared laser light by intersubband transition. The photonic crystal layer is placed on the active layer. The photonic crystal layer includes a first region provided with a rectangular grating having optical anisotropy and a second region provided with the rectangular grating. The rectangular grating of the first region is orthogonal to the rectangular grating of the second region. In the first region, the first infrared laser light has a first wavelength corresponding to a maximum gain outside a first photonic bandgap in a direction parallel to a first side of two sides constituting the rectangular grating. The first infrared laser light lases in the direction parallel to the first side. In the second region, the second infrared laser light has a second wavelength corresponding to a maximum gain outside a second photonic bandgap in a direction parallel to a second side of the two sides of the rectangular grating. The second infrared laser light lases in the direction parallel to the second side. Part of the first infrared laser light flows into the second region and is capable of existing in the second region. The first and second infrared laser light are emitted in a direction generally perpendicular to the active layer.

Embodiments of the invention will now be described with reference to the drawings.

Figure 1A:
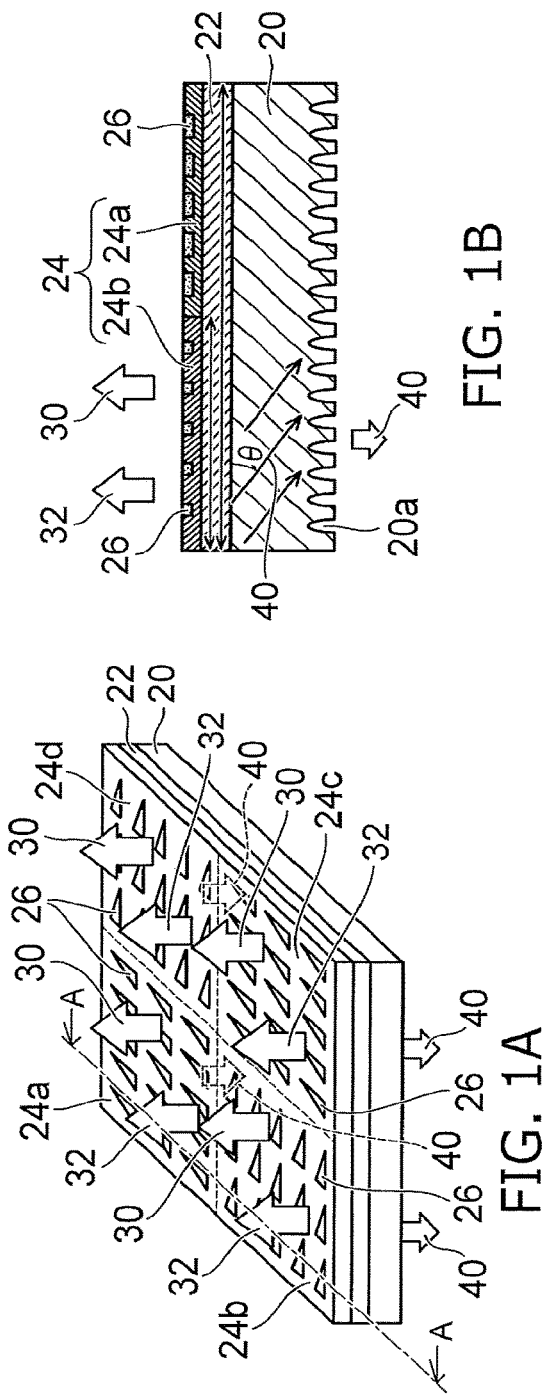
FIG. 1A is a schematic perspective view of a surface-emitting quantum cascade laser according to a first embodiment.
Figure 1C:
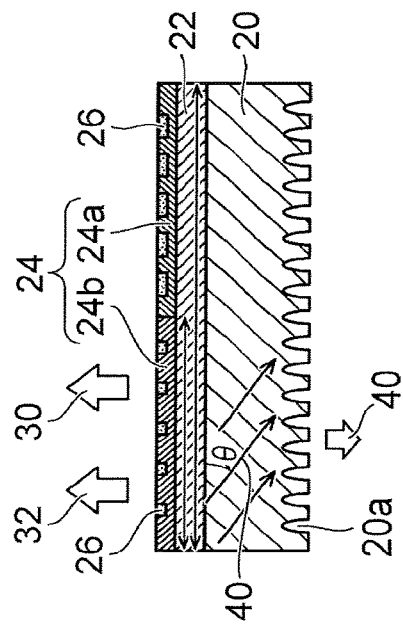
FIG. 1C is a schematic perspective view of the substrate back surface.
Figure 1B:
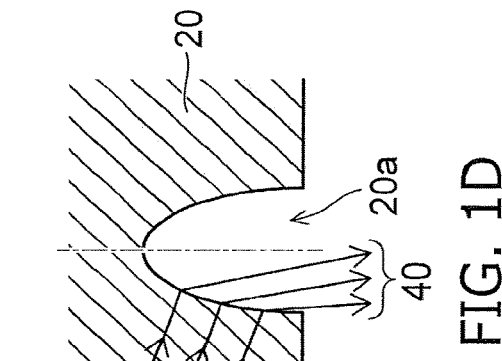
FIG. 1B is a schematic sectional view taken along line A-A.
Figure 1D:
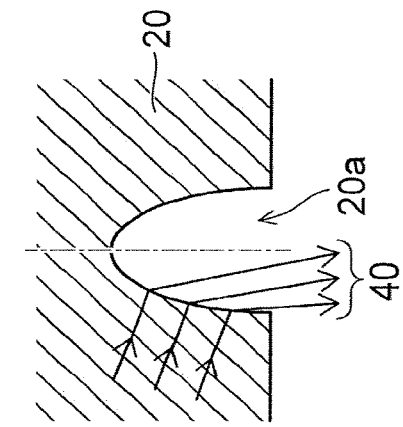
FIG. 1D is a schematic sectional view of the depression for changing the outgoing direction of terahertz waves.

FIG. 1A is a schematic perspective view of a surface-emitting quantum cascade laser according to a first embodiment. FIG. 1B is a schematic sectional view taken along line A-A. FIG. 1C is a schematic perspective view of the substrate back surface. FIG. 1D is a schematic sectional view of the depression for changing the outgoing direction of terahertz waves.

The surface-emitting quantum cascade laser 10 includes a substrate 20, an active layer 22, and a photonic crystal layer 24.

The active layer 22 is provided on the substrate 20. The polarization occurring inside the active layer 22 has nonlinearity with respect to the electric field. The active layer 22 can emit infrared laser light by intersubband transition. The active layer 22 can be formed by cascade connection of quantum well layers in which well layers made of $In_xGa_{1-x}As$ (0<x<1) and barrier layers made of $In_yAl_{1-y}As$ (0<y<1) are stacked alternately.

The photonic crystal layer 24 (24a, 24b, 24c, 24d) is placed on the active layer 22. The photonic crystal layer 24 includes a first region 24a provided with a rectangular grating having optical anisotropy and a second region 24b provided with the rectangular grating of the same shape. The rectangular grating of the first region 24a is orthogonal to the rectangular grating of the second region 24b. That is, the first side 60 of the two-dimensional grating constituting the rectangular grating of the first region 24a is orthogonal to the first side 60 of the second region 24b. The planar shape of the second region 24b may be vertically symmetric with respect to the side parallel to the first side 60, or may be horizontally symmetric with respect to the side parallel to the second side 70. FIG. 1A shows a portion of the chip surface. In this figure, the first to fourth regions 24a-24d are adjacent to each other and constitute a checkerboard pattern.

Next, the emission direction of laser light in the first region 24a and the second region 24b is described. In the first to fourth regions 24a-24d, an infrared laser light 30 having a first wavelength and an infrared laser light 32 having a second wavelength are diffracted by the two-dimensional orthogonal grating and emitted in a generally perpendicular direction. In this specification, the "generally perpendicular direction" refers to a direction of 81 degrees or more and 99 degrees or less.

The active layer 22 contains e.g. AlGaAs or InAlAs. Then, the polarization P induced in the active layer 22 can be expressed by equation (1) using the electric field E of light:

$$P = \chi_1 E + \chi_2 E^2 + \chi_3 E^3 + \ldots \quad (1)$$

where $\chi_1, \chi_2, \chi_3, \ldots$ are electric susceptibilities.

The polarization P exhibits optical nonlinearity when there are higher order terms with respect to the electric field E. Thus, as shown in FIG. 1B, difference frequency light of the first wavelength and the second wavelength is generated by Cherenkov phase matching in the region of the active layer 22 below the first to fourth regions 24a-24d and emitted outside as a terahertz wave 40 from the substrate 20. The terahertz wave has a frequency of e.g. 30 GHz to 30 THz.

The terahertz wave 40 generated as difference frequency light is emitted toward the substrate 20 with inclination of the Cherenkov angle from the active layer 22. As shown in FIGS. 1B, 1C, and 1D, depressions 20a having a wedge-shaped cross section are two-dimensionally provided in the back surface of the substrate 20. Thus, the terahertz wave 40 can be emitted with an angle nearly perpendicular to the back surface of the substrate 20. The depression 20a is provided with a lower refractive index than air or the substrate 20 to refract the terahertz wave 40 downward. This facilitates emission to the outside. The cross section of the depression is expanded downward. This facilitates making the outgoing angle close to perpendicular.

In FIGS. 1A to 1C, a cladding layer and the like can be provided between the active layer 22 and the photonic crystal layer 24. Furthermore, a cladding layer and the like can be provided between the active layer 22 and the substrate 20.

Figure 2:
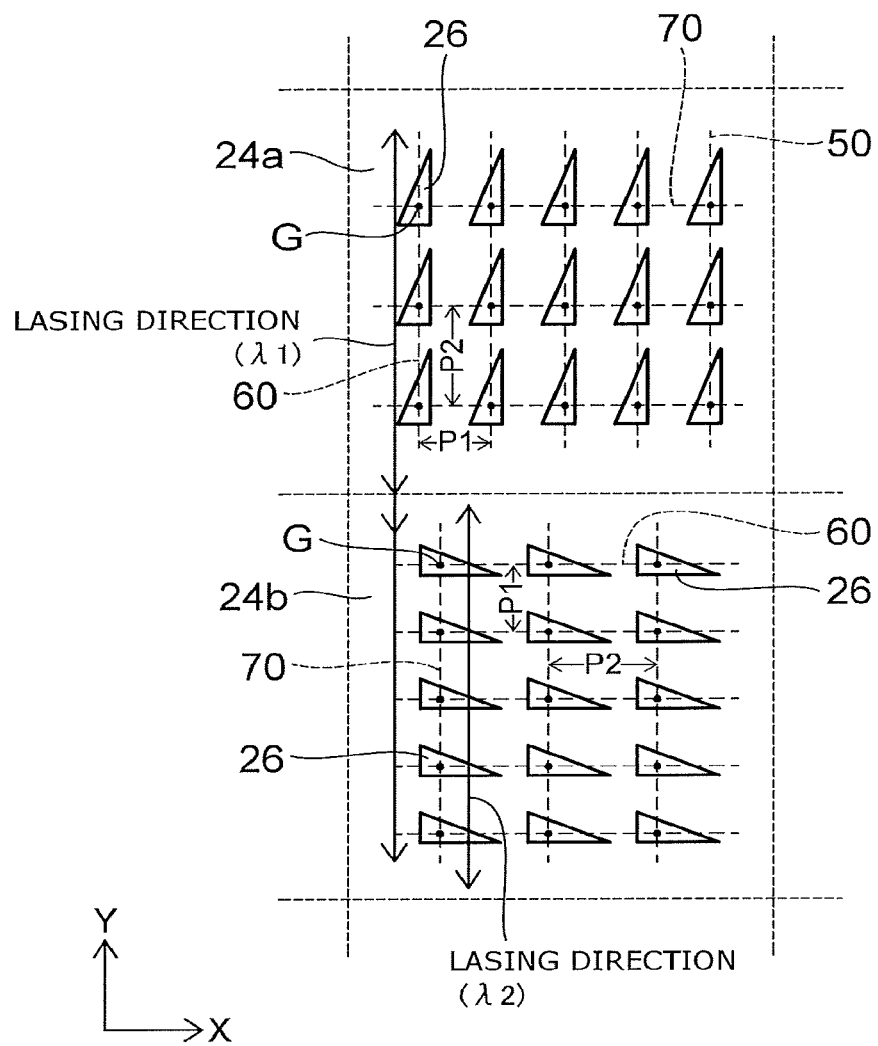
FIG. 2 is a schematic plan view of the rectangular grating provided in the surface of the first and second regions of the photonic crystal layer.

FIG. 2 is a schematic plan view of the rectangular grating provided in the surface of the first and second regions of the photonic crystal layer.

In the first region 24a, the direction parallel to the first side 60 of the two sides constituting the two-dimensional rectangular grating is parallel to the Y-axis. The direction parallel to the second side 70 of the two sides constituting the two-dimensional rectangular grating is parallel to the X-axis. The rectangular grating is composed of pit parts 26. The pit parts 26 have a refractive index different from the surrounding refractive index. Each pit part of the pit parts 26 is shaped so that the length along the first side 60 is longer than the length along the second side 70 in the first region 24a. The each pit part can have a lower refractive index than the photonic crystal layer 24. The each pit part can be e.g. an air layer of the depression provided on the front surface side of the photonic crystal layer 24 or a silicon dioxide layer packed in the depression.

The each pit part is shaped to be asymmetric with respect to the lines passing through the barycenter G of the each pit part and being parallel to the first side 60 and the second side 70, respectively. Thus, the infrared laser light 30, 32 is diffracted by the photonic crystal layer 24 and emitted upward from the front surface. The boundary between the respective regions is shown by dashed lines.

In the rectangular grating, the spacing between the first sides 60 is represented by first pitch P1, and the spacing between the second sides 70 is represented by second pitch P2. The wavelength of the first infrared laser light 30 in the single mode is assumed to be 4.3 µm (frequency 69.7192 THz, wave number 2326 cm$^{-1}$). The wavelength of the second infrared laser light 32 in the single mode is assumed to be 4.4 µm (frequency 68.1346 THz, wave number 2273 cm$^{-1}$). In this case, terahertz laser light 40 is generated with a difference frequency of 15.8453 THz (wavelength 189.2 µm).

The first pitch P1 can be selected e.g. in the neighborhood of the in-medium wavelength corresponding to 4.3 µm, the free-space wavelength. The second pitch P2 can be selected e.g. in the neighborhood of the in-medium wavelength corresponding to 4.4 µm, the free-space wavelength.

Figure 3A:
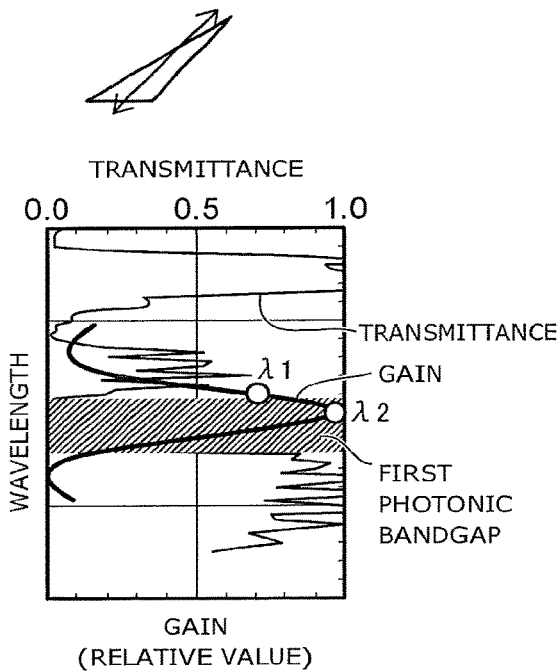
FIG. 3A is a graph showing the dependence of transmittance on wavelength and the dependence of gain on wavelength in the photonic band in the direction parallel to the first side of the first region.
Figure 3C:
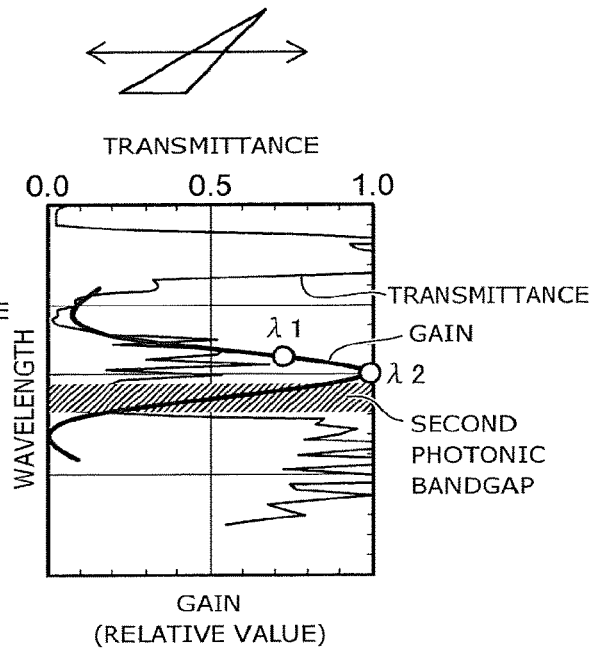
FIG. 3C is a graph showing another example of the dependence of transmittance on wavelength and the dependence of gain on wavelength in the photonic band in the direction parallel to the second side of the second region.
Figure 3B:
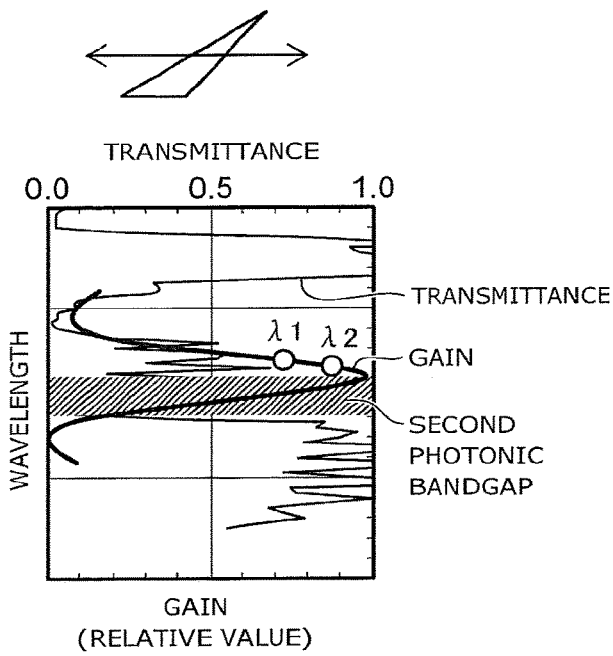
FIG. 3B is a graph showing the dependence of transmittance on wavelength and the dependence of gain on wavelength in the photonic band in the direction parallel to the second side of the second region.

FIG. 3A is a graph showing the dependence of transmittance on wavelength and the dependence of gain on wavelength in the photonic band in the direction parallel to the first side of the first region. FIG. 3B is a graph showing the dependence of transmittance on wavelength and the dependence of gain on wavelength in the photonic band in the direction parallel to the second side of the second region. FIG. 3C is a graph showing another example of the dependence of transmittance on wavelength and the dependence of gain on wavelength in the photonic band in the direction parallel to the second side of the second region.

The vertical axis represents wavelength (relative value). The horizontal axis represents transmittance (relative value). In the graph of the dependence of gain spectrum on wavelength, the vertical axis represents gain, and the horizontal axis represents wavelength.

As shown in FIG. 3A, the first region 24a lases in the direction parallel to the first side 60 with a first wavelength λ1 corresponding to the maximum gain outside a first photonic bandgap (forbidden band) in the direction parallel to the first side 60 of the rectangular grating.

As shown in FIG. 3B, the second region 24b lases in the direction parallel to the second side 70 with a second wavelength λ2 corresponding to the maximum gain (but not at the gain spectrum peak) outside a second photonic bandgap in the direction parallel to the second side 70 of the rectangular grating. The rectangular grating of the second region 24b is obtained by e.g. rotating the diffraction grating of the first region 24a clockwise by 90 degrees. Thus, the first side 60 of the first region 24a and the second side 70 of the second region 24b are parallel to each other and both parallel to the Y-axis. In FIG. 3C, the second wavelength λ2 lies outside the second photonic bandgap, and thus corresponds to the gain spectrum peak. That is, the surface-emitting quantum cascade laser of the first embodiment can emit two infrared laser lights with different wavelengths.

Part of the infrared laser light 30 of the first wavelength λ1 lasing in the first region 24a flows into the second region 24b and can exist in the second region 24b (lies outside the second photonic bandgap). As a result, in the second region 24b, difference frequency light of the first wavelength light and the second wavelength light is generated by Cherenkov phase matching based on optical nonlinearity and emitted outside as a terahertz wave 40 from the substrate 20.

Figure 4:
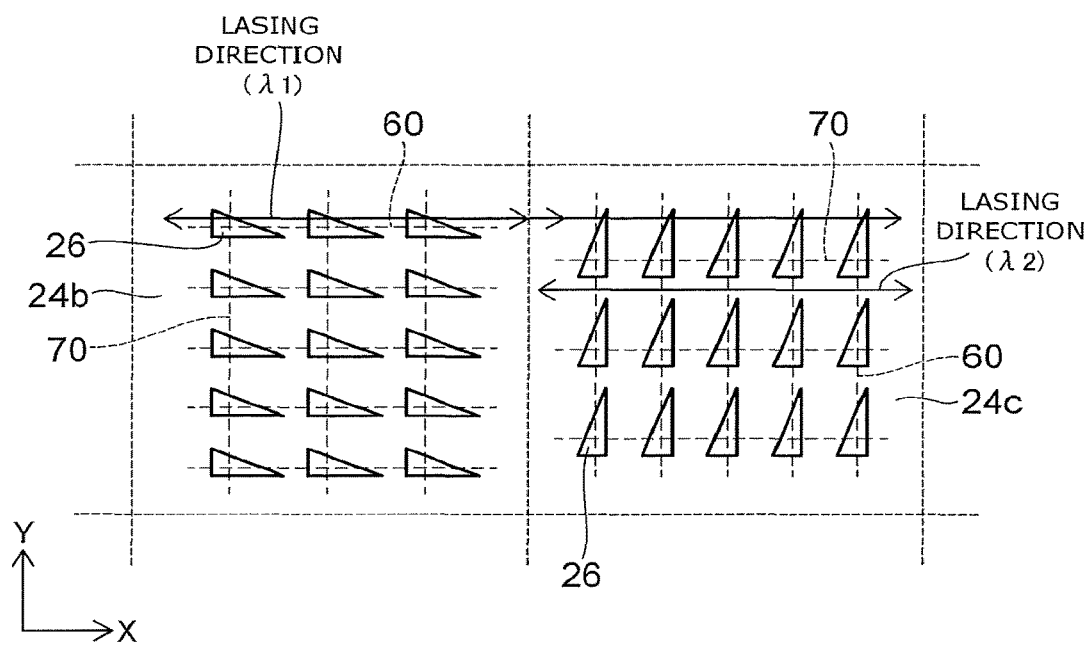
FIG. 4 is a schematic plan view of a rectangular grating provided in the surface of the second and third regions of the photonic crystal layer.

FIG. 4 is a schematic plan view of a rectangular grating provided in the surface of the second and third regions of the photonic crystal layer.

In the second region 24b, the first side 60 constituting the two-dimensional rectangular grating is parallel to the X-axis. In the third region 24c, the second side 70 constituting the two-dimensional rectangular grating is parallel to the X-axis.

As shown in FIG. 3A, the second region 24b lases in the direction parallel to the first side 60 with the first wavelength λ1 corresponding to the maximum gain outside the first photonic bandgap (forbidden band) in the direction parallel to the first side 60 of the rectangular grating.

As shown in FIG. 3B, the third region 24c lases in the direction parallel to the second side 70 with the second wavelength λ2 corresponding to the maximum gain outside the second photonic bandgap in the direction parallel to the second side 70 of the rectangular grating.

Part of the first infrared laser light 30 lasing in the second region 24b and having the first wavelength λ1 flows into the third region 24c and can exist in the third region 24c (lies outside the second photonic bandgap). In the third region 24c, difference frequency light of the first infrared laser light and the second infrared laser light is generated by Cherenkov phase matching based on optical nonlinearity and emitted outside as a terahertz wave 40 from the substrate 20.

Likewise, when the third region 24c is adjacent to the fourth region 24d, the fourth region 24d can emit a terahertz wave.

Likewise, when the fourth region 24d is adjacent to the first region 24a, the first region 24a can emit a terahertz wave. That is, as shown in FIG. 1A, when the rectangular grating is configured to form a checkerboard pattern, each region 24a-24d can emit a terahertz wave.

The terahertz wave is emitted from the substrate 20 with Cherenkov angle θ represented by equation (2) with respect to the surface of the active layer 22:

$$\cos\theta = \frac{\lambda_{THz}/n_{THz}}{\lambda_1\lambda_2/(n_1\lambda_2 - n_2\lambda_1)} \cong \frac{n_{opt}}{n_{THz}} \quad (2)$$

where
  $n_{THz}$: refractive index of terahertz wave in undoped InP
  $n_{opt}$: refractive index of infrared radiation in active layer
  n1: effective refractive index of first infrared laser light≈$n_{opt}$
  n2: effective refractive index of second infrared laser light≈$n_{opt}$
  λ1: wavelength of first infrared laser light
  λ2: wavelength of second infrared laser light For instance, $n_{THz}$=3.6 and $n_{opt}$=3.4 at a wavelength of 3-5 μm. Then, the Cherenkov emission angle θ is approximately 20°.

Figure 5A:
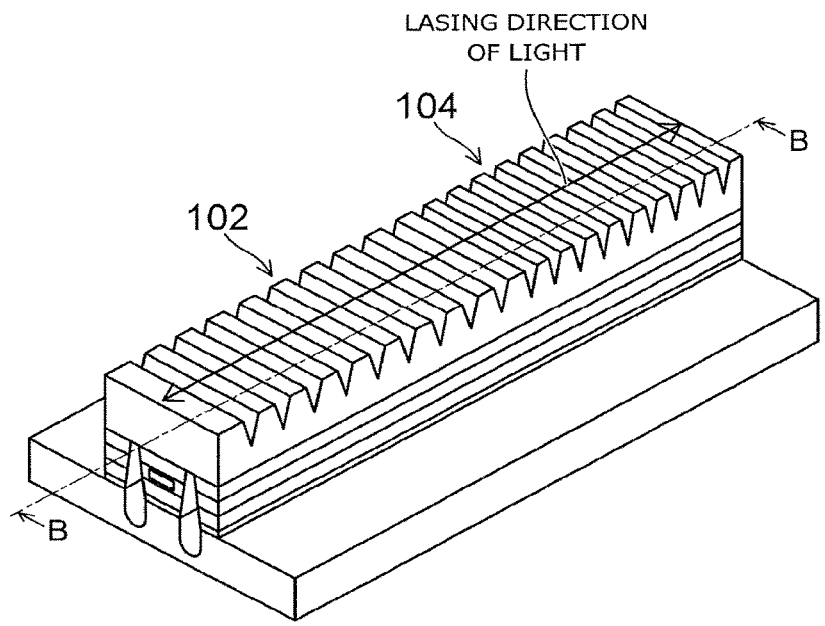
FIG. 5A is a schematic perspective view of a quantum cascade laser of the ridge waveguide type according to a comparative example.
Figure 5B:
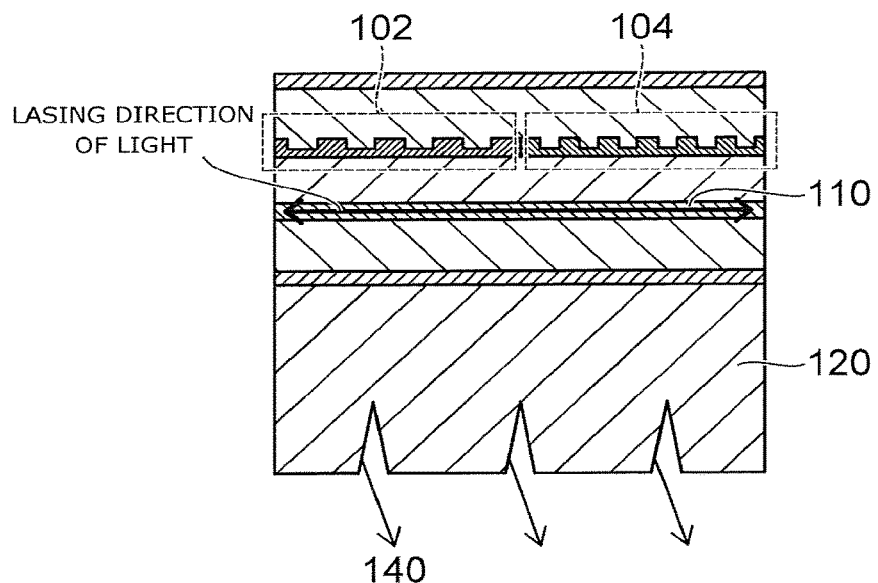
FIG. 5B is a schematic sectional view taken along line B-B.

FIG. 5A is a schematic perspective view of a quantum cascade laser of the ridge faveguide type, according to a comparative example. FIG. 56 is a schematic sectional view taken along line B-B.

FIG. 5A shows a state in which grating regions 102, 104 having different pitches are exposed. FIG. 56 is a schematic sectional view after the two grating regions are buried from above and an upper electrode is provided.

In the quantum cascade laser according to the comparative example, two grating regions 102, 104 having different pitches along line B-B are connected in series. Thus, two different infrared laser lights can each lase along line B-B and can be emitted along line B-B. On the other hand, difference frequency light of the two infrared laser lights is emitted toward the substrate 120 while keeping the Cherenkov emission angle θ due to optical nonlinearity of the active layer 110. A groove part 140a is provided in the back surface of the substrate 120. Thus, the difference frequency light (terahertz wave) is emitted downward from the chip. In this configuration, it is difficult to emit a surface-emitting terahertz wave 140.

In contrast, this embodiment provides a quantum cascade laser capable of emitting a terahertz wave with uniform and high-power surface emission over a large area from a photonic crystal layer having a checkerboard pattern. For instance, when e.g. a specific toxic substance in a paper bag is irradiated with the terahertz wave, the presence or absence and the shape of the specific substance can be detected by measuring the transmission wave or reflection wave intensity. In this case, the configuration and the like of the irradiation optical system are made easier by using the surface-emitting laser than the ridge-waveguide laser.

FIG. 6A is a schematic perspective view of an example of the chip provided with an upper electrode and a lower electrode in the first embodiment. FIG. 6B is a schematic sectional view taken along line A-A. FIG. 6C is a schematic perspective view of the back surface of the chip. FIG. 6D is a schematic perspective view showing an example of the emission direction of the infrared laser light and the terahertz wave.

The upper electrode 80 can be provided e.g. like a frame in the peripheral part of each region 24a-24d partitioned in the photonic crystal layer 24. Stripe electrodes may be arranged with a suitable pitch so as to partition each region 24a-24d into subregions. This facilitates injecting a current uniformly into each region.

On the other hand, as shown in FIGS. 6C and 6D, the lower electrode 82 is provided on the entire back surface of the chip. Then, the terahertz wave 40 emitted downward from the chip back surface is reflected by the lower electrode 82 and emitted upward. Thus, the terahertz wave is emitted upward from the chip. The surface-emitting quantum cascade laser according to the embodiments of this application can be configured more simply than the configuration for generating a terahertz wave as difference frequency light by irradiating a nonlinear crystal such as KTP-OPO ($KTiOPO_4$ optical parametric oscillator) with two infrared laser lights.

Figure 7A:
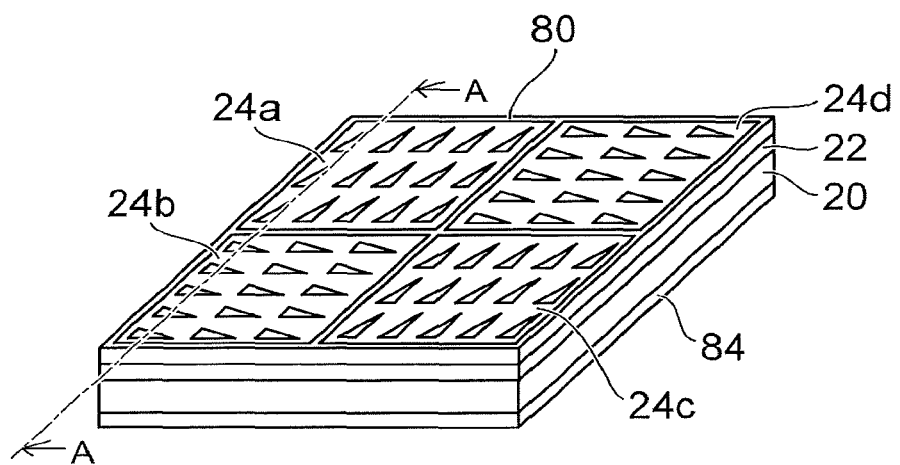
FIG. 7A is a schematic perspective view of a surface-emitting quantum cascade laser according to a second embodiment.
Figure 7B:
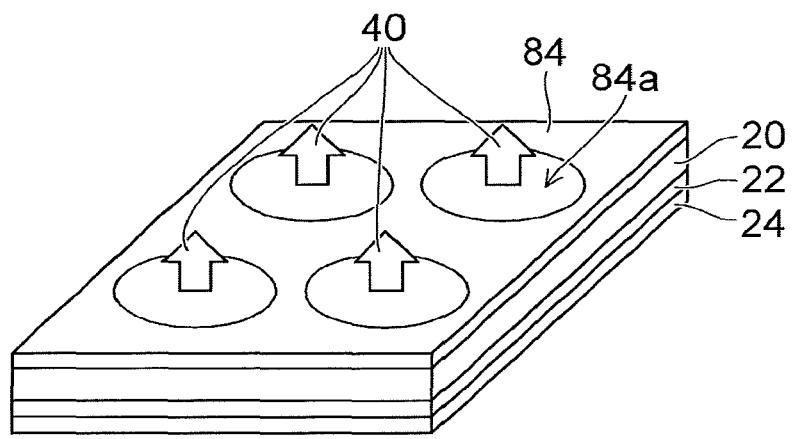
FIG. 7B is a schematic perspective view of the chip as viewed from the back surface side.

FIG. 7A is a schematic perspective view of a surface-emitting quantum cascade laser according to a second embodiment. FIG. 7B is a schematic perspective view of the chip as viewed from the back surface side.

A lower electrode 84 provided with an opening 84a is provided on the back surface of each region (24a-24d). The terahertz wave 40 is emitted downward from the chip through the opening 84a from each region 24a-24d. The current density is lower in the upper region of the opening 84a between the upper electrode 80 and the lower electrode 84. The quantum cascade laser emits light by intersubband transition. Thus, the decrease in optical output due to optical absorption is smaller even in the region of low current density (compared with recombination emission of electrons and holes).

Figure 8:
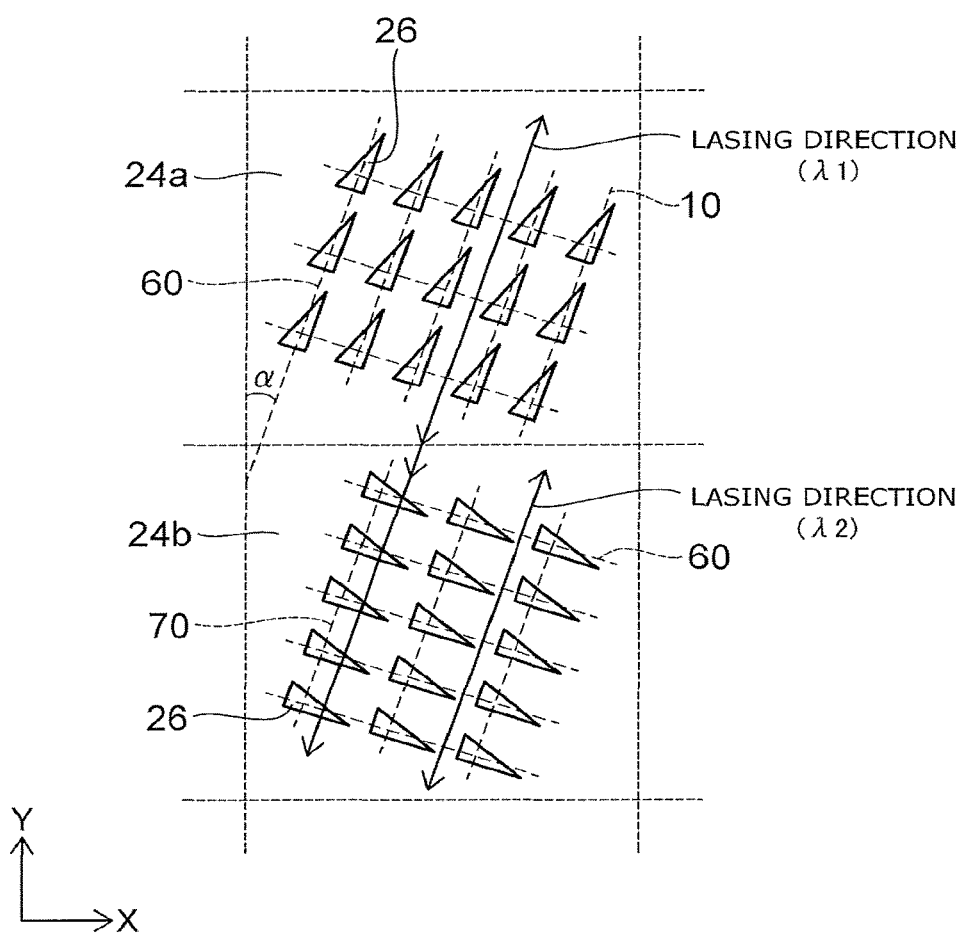
FIG. 8 is a schematic plan view showing a variation of the arrangement of the rectangular grating.
Figure 9A:
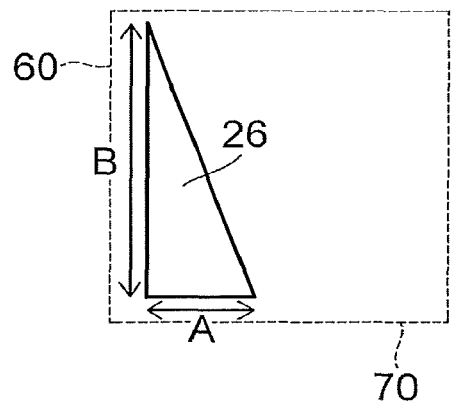
FIGS. 9A to 9E are schematic plan views showing examples of the pit part.
Figure 9B:
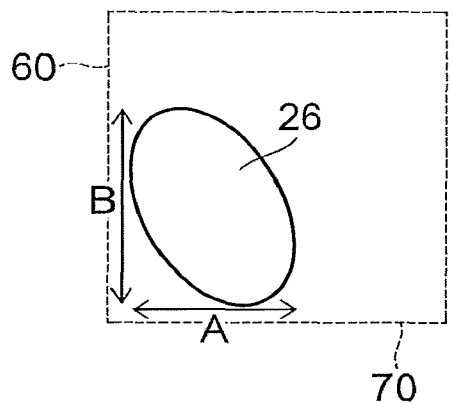
Figure 9C:
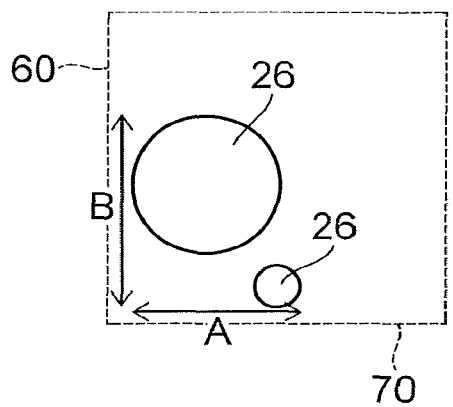
Figure 9D:
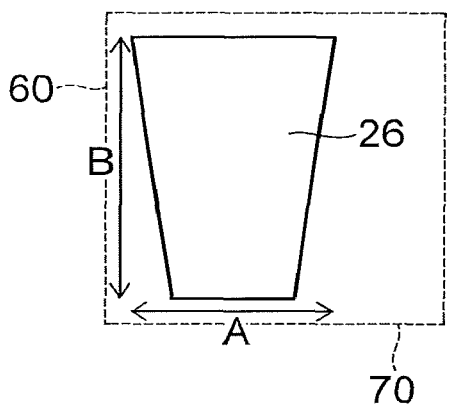
Figure 9E:
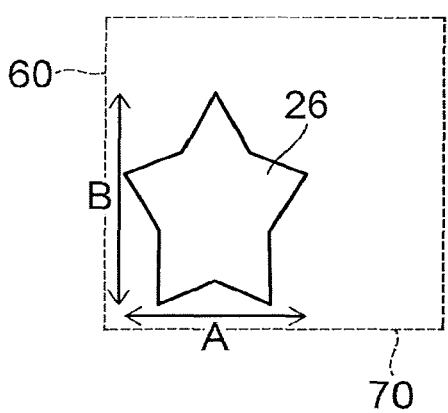

FIG. 8 is a schematic plan view showing a variation of the arrangement of the rectangular grating.

FIG. 2 illustrates the case where the first side 60 of the rectangular grating is parallel to the Y-axis (i.e. the first direction). The embodiments of the invention are not limited to this arrangement. That is, the first side 60 of the rectangular grating may cross the Y-axis with angle α. The angle α can be made larger than zero and smaller than 45 degrees.

FIGS. 9A to 9E are schematic plan views showing examples of the pit part.

In the planar shape of the pit part 26, the length B in the direction parallel to the first side 60 of the rectangular grating is larger than the length A in the direction parallel to the second side 70. That is, the aspect ratio defined as the ratio of B to A is made larger than 1. FIGS. 9A to 9E show examples of a triangle, an inclined ellipse, a combination of two large and small circles, a trapezoid, and a polygon. However, the planar shape of the pit part is not limited thereto.

The embodiments provide a surface-emitting quantum cascade laser capable of emitting two infrared laser lights having different wavelengths. Thus, for instance, a terahertz wave can be emitted as difference frequency light of the two infrared laser lights. The presence or absence and the shape of a specific substance housed in e.g. a paper container can be detected by irradiation with the terahertz wave and detection of the reflection wave or transmission wave thereof.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A surface-emitting quantum cascade laser comprising:
   a substrate;
   an active layer provided on the substrate, having optical nonlinearity, and being capable of emitting a first and a second infrared laser light by intersubband transition; and
   a photonic crystal layer placed on the active layer and including a first region provided with a rectangular grating having optical anisotropy and a second region provided with the rectangular grating, the rectangular grating of the first region being orthogonal to the rectangular grating of the second region,
   in the first region, the first infrared laser light having a first wavelength corresponding to a maximum gain outside a first photonic bandgap in a direction parallel to a first side of two sides constituting the rectangular grating, and the first infrared laser light lasing in the direction parallel to the first side,
   in the second region, the second infrared laser light having a second wavelength corresponding to a maximum gain outside a second photonic bandgap in a direction parallel to a second side of the two sides of the rectangular grating, and the second infrared laser light lasing in the direction parallel to the second side,
   part of the first infrared laser light flowing into the second region and being capable of existing in the second region, and
   the first and second infrared laser light being emitted in a direction generally perpendicular to the active layer.

2. The laser according to claim 1, wherein the second wavelength corresponds to a gain spectrum peak.

3. The laser according to claim 1, wherein
   the first region and the second region are arranged in a checkerboard pattern, and
   in each region constituting the checkerboard pattern, difference frequency light of the first infrared laser light and the second infrared laser light is generated by Cherenkov phase matching based on the optical nonlinearity and emitted outward as a terahertz wave from the substrate.

4. The laser according to claim 2, wherein
   the first region and the second region are arranged in a checkerboard pattern, and
   in each region constituting the checkerboard pattern, difference frequency light of the first infrared laser light and the second infrared laser light is generated by Cherenkov phase matching based on the optical nonlinearity and emitted outward as a terahertz wave from the substrate.

5. The laser according to claim 1, wherein the first photonic bandgap is larger than the second photonic bandgap.

6. The laser according to claim 2, wherein the first photonic bandgap is larger than the second photonic bandgap.

7. The laser according to claim 3, wherein the first photonic bandgap is larger than the second photonic bandgap.

8. The laser according to claim 1, wherein
   the rectangular grating is composed of pit parts having a lower refractive index than the photonic crystal layer therearound, length of each pit part in the direction parallel to the first side is larger than length parallel to the second side, and
   the each pit part is shaped to be asymmetric with respect to lines passing through a barycenter of the each pit part and being parallel to the first side and the second side, respectively.

9. The laser according to claim 3, wherein depressions capable of refracting the difference frequency light to a perpendicular outward direction are two-dimensionally provided in a back surface of the substrate.

10. The laser according to claim 3, further comprising:
    a lower electrode provided on a back surface of the substrate and reflecting the difference frequency light upward.

11. The laser according to claim 3, further comprising:
    a lower electrode provided on a back surface of the substrate and provided with an opening,
    the difference frequency light being emitted outside through the opening.

12. The laser according to claim 8, further comprising:
    an upper electrode having a frame shape and provided in a peripheral part of the each region, wherein
    the each pit part is provided so as not to overlap the upper electrode.

* * * * *